US010416695B1

(12) United States Patent
Bohannon

(10) Patent No.: US 10,416,695 B1
(45) Date of Patent: Sep. 17, 2019

(54) LINEAR REGULATOR WITH FIRST AND SECOND FEEDBACK VOLTAGES

(71) Applicant: SYNAPTICS INCORPORATED, San Jose, CA (US)

(72) Inventor: Eric Bohannon, Rochester, NY (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/012,698

(22) Filed: Jun. 19, 2018

(51) Int. Cl.
*G05F 1/565* (2006.01)
*G05F 1/575* (2006.01)
*G05F 1/59* (2006.01)
*H03F 3/45* (2006.01)

(52) U.S. Cl.
CPC ............. *G05F 1/575* (2013.01); *G05F 1/59* (2013.01); *H03F 3/45192* (2013.01); *H03F 3/45273* (2013.01); *G05F 1/565* (2013.01); *H03F 2203/45512* (2013.01)

(58) Field of Classification Search
CPC .......... G05F 1/565; G05F 1/575; G05F 1/461; G05F 1/569; G05F 1/5735; G05F 1/571; G05F 1/573; H03F 2203/45512; H03F 3/45273; H03F 3/45192
See application file for complete search history.

(56) References Cited

U.S. PATENT DOCUMENTS 6,465,994 B1 * 10/2002 Xi ........................... G05F 1/575
 323/274
2005/0206444 A1 * 9/2005 Perez ....................... H03F 1/08
 327/540
2007/0159146 A1 * 7/2007 Mandal ................... G05F 1/575
 323/280
2013/0027010 A1 * 1/2013 Groeneweg ............. G05F 1/575
 323/280
2013/0249294 A1 * 9/2013 Saito ....................... G05F 1/575
 307/43

OTHER PUBLICATIONS

Al-Shyoukh et al. "A Transient-Enhanced Low-Quiescent Current Low-Dropout Regulator with Buffer Impedance Attenuation", IEEE Journal of Solid-State Circuits, Aug. 2007, vol. 42, No. 8, pp. 1732-1742.

* cited by examiner

*Primary Examiner* — Harry R Behm
(74) *Attorney, Agent, or Firm* — Haynes and Boone, LLP

(57) ABSTRACT

A voltage regulation system includes an error amplifier configured to generate an error amplifier output based on a reference voltage, input voltage, first feedback voltage, and second feedback voltage. The feedback voltages are based on a first output voltage at the system's output node. The system further includes a capacitor configured to provide the first feedback voltage to the error amplifier. The system further includes a voltage-controlled current source configured to generate a current based on the first output voltage. The second feedback voltage is based on the current. The system further includes a transistor configured to provide a second output voltage at the output node based on the error amplifier output. The transistor is connected to the output node and the capacitor. Such a voltage regulation system may allow a high power supply rejection response over a wide range of frequencies and loads while maintaining stability and phase margin.

18 Claims, 7 Drawing Sheets

LINEAR REGULATOR WITH FIRST AND SECOND FEEDBACK VOLTAGES

TECHNICAL FIELD

The present application, in accordance with one or more embodiments, relates generally to electronic devices and, more particularly, for example, to voltage regulation systems and methods.

BACKGROUND

Signal processing systems may be powered by power supplies whose noise may couple into circuitry of the signal processing systems. In one example, the signal processing systems may be audio processing systems. In some cases, the noise may have frequency components (e.g., energy at frequencies) that may coincide with operation of the signal processing systems, thus adversely affecting performance of the signal processing systems.

SUMMARY

In accordance with various embodiments further discussed herein, voltage regulation systems and methods are provided. In some embodiments, such systems and methods may provide architectures that allow for a high power supply rejection response over a wide frequency range and wide range of loads while maintaining stability and phase margin. In some aspects, such systems and methods may be utilized to provide a regulated voltage to a device and prevent coupling of signals (e.g., voltage signals) from noisy power supplies to sensitive circuitry of the device. As one example, the device may be an audio processing device.

In one or more embodiments, a voltage regulation system includes an error amplifier configured to generate an error amplifier output based at least on a reference voltage, first input voltage, first feedback voltage, and second feedback voltage. The first and second feedback voltages are based on a first output voltage at an output node of the voltage regulation system. The voltage regulation system further includes a capacitor configured to provide the first feedback voltage to a first node of the error amplifier. The voltage regulation system further includes a voltage-controlled current source configured to generate a current based on the first output voltage. The second feedback voltage is based on the current. The voltage regulation system further includes a first transistor configured to provide a second output voltage at the output node based on the error amplifier output. The first transistor is connected to the output node and the capacitor.

In one or more embodiments, a method includes generating, by an error amplifier, a first error amplifier output based at least on a reference voltage, first input voltage, and first plurality of feedback voltages. Each of the first plurality of feedback voltages is based on a first output voltage at an output node of a voltage regulation system. The first output voltage is provided to a load. The method further includes generating, by a first transistor, a second output voltage at the output node based on the first error amplifier output. The second output voltage is provided to the load. The method further includes providing, by a capacitor, a first feedback voltage of a second plurality of feedback voltages to a first node of the error amplifier. The first feedback voltage is based on the second output voltage. The method further includes generating, by a voltage-controlled current source, a current based on the second output voltage. The method further includes providing, by a feedback network, a second feedback voltage of the second plurality of feedback voltages to a second node of the error amplifier. The second feedback voltage is based on current from the voltage-controlled current source through the feedback network.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Figure 1:
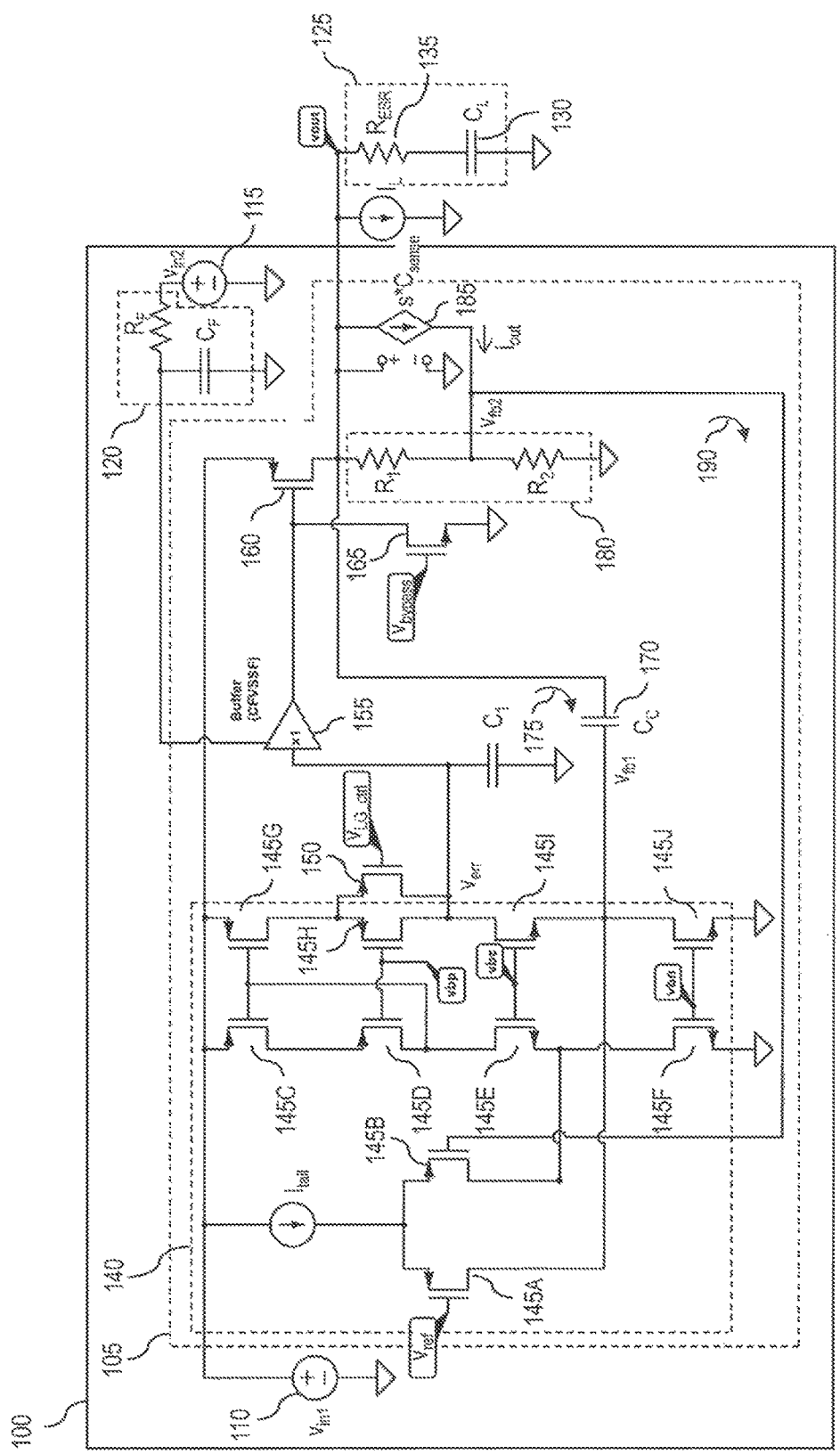
FIG. 1 illustrates an example of a voltage regulation system for providing an output voltage to a load in accordance with one or more embodiments of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various techniques are provided herein to provide voltage regulation. In some embodiments, linear regulator architectures are provided that may allow high power supply rejection (PSR) over a wide frequency range, such as up to at least 3 MHz. The high PSR may be provided while maintaining a certain level of phase margin (PM), linear regulator size, power consumption, and/or other performance and/or physical device characteristics. An example range of the phase margin may be between around 20° and around 45°. In some embodiments, the linear regulator architectures may achieve a higher PSR relative to a conventional linear regulator by using multiple power supply voltages to power a linear regulator, utilizing a compensation capacitor (e.g., for providing cascoded Miller compensation) together with a voltage-controlled current source that provides a left-hand plane (LHP) zero (e.g., in a $v_{out}/v_{ref}$ transfer function), inserting a buffer between a first stage of the linear regulator (e.g., an output of an error amplifier of the linear regulator) and a pass transistor of the linear regulator, and designing the first stage with high gain. In one example, a power supply voltage applied to the buffer of the linear regulator may be different from a power supply voltage applied to the error amplifier of the linear regulator. In one example, a gain of the first stage may be between around 10,000 and around 20,000 at direct current (DC).

In general, the linear regulator architectures described herein may be utilized in any product or application in which voltage regulation is desired. In this regard, a linear regulator implemented with the architectures described herein may be utilized to produce a voltage at a near-constant level based at least on a reference voltage $v_{ref}$ irrespective of power supply variations, temperature changes, loading on the linear regulator, etc. The linear regulator architectures may be utilized as part of a general-purpose system, an application specific system, or generally any system, device, and/or method in which voltage regulation is desired. As an example, a linear regulator implemented with the architectures described herein may be built into an analog application-specific integrated circuit (ASIC) of an Internet of Things (IoT) product. In some aspects, the linear regulator architectures may provide the high PSR over a wide frequency range while maintaining stability and phase margin and accommodating a wide variety of loads, including a wide range of load currents, load capacitors, and/or equivalent series resistance (ESR) of the load capacitors. In this regard, in some cases, the linear regulator architectures may accommodate a load capacitor with a small ESR. In one case, a small ESR may be an ESR less than around 200 mΩ.

In some embodiments, such linear regulator architectures may be particularly well-suited for audio processing systems, such as audio processing systems provided as part of audio IoT products. Example audio IoT products may include a headphone device (e.g., an earbud), a microphone device, or generally any audio input, audio output, and/or audio processing device with IoT functionality (e.g., connectivity capability).

In some cases, the audio IoT products may include or may be coupled to noisy power supplies, such as switching power supplies that generally exhibit switching noise. Switching noise may couple into sensitive circuitry of the audio IoT products and degrade performance. A frequency spectrum of a voltage ripple generated by switching power supplies may have energy at frequencies that may adversely affect performance of circuitry (e.g., sensitive circuitry) in the IoT products. For example, the energy may have frequency components within 20 kHz to 2 MHz. This frequency range may coincide with frequencies at which a high PSR may be desired (e.g., based on an application and/or a device specification of the IoT product). The linear regulator architectures described herein may be placed between the noisy power supplies (e.g., switching power supplies) and circuitry such that the voltage ripple is attenuated and thus poses no issues for the circuitry (e.g., sensitive IoT circuitry). In this regard, the noise associated with the power supplies is effectively decoupled at least from the sensitive circuitry of the audio IoT products.

In some embodiments, the attenuation, by a linear regulator, of the voltage ripple associated with noisy power supplies (e.g., switching power supplies) may be, or may be indicative of, the PSR of the linear regulator. As such, the PSR may also be referred to as ripple rejection. In this regard, the PSR of a linear regulator may provide a quantitative measure of a capability of the linear regulator to maintain an output voltage at a constant value even when an input voltage varies (e.g., exhibits ripple or other noise fluctuation). Although the foregoing description of noisy power supplies (e.g., switching power supplies) is described with reference to audio processing systems, the linear regulator architectures may be employed to mitigate noise associated with noisy power supplies in generally any system that may utilize noisy power supplies.

Turning now to the figures, FIG. 1 illustrates an example of a voltage regulation system 100 for providing an output voltage $v_{out}$ to a load 125 in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components.

The voltage regulation system 100 includes a linear regulator 105, power supply 110, power supply 115, and filter circuit 120. The linear regulator 105 may generate the output voltage $v_{out}$ (e.g., also referred to as a regulated voltage) at an output node of the linear regulator 105 based on an input voltage $v_{in1}$ supplied by the power supply 110. The output node of the linear regulator 105 may also be referred to as an output node of the voltage regulation system 100. The output voltage $v_{out}$ may be provided to the load 125. The linear regulator 105 may be utilized to produce an output voltage at a constant or near-constant level based at least on a reference voltage $v_{ref}$ irrespective of power supply variations (e.g., voltage fluctuations, voltage ripple), temperature changes, loading on the linear regulator 105 (e.g., represented by the load 125), and/or other operating conditions/environments or fluctuations to such conditions/environments. For example, the reference voltage $v_{ref}$ may be provided by a reference voltage generator, such as a bandgap voltage reference circuit. In FIG. 1, the load 125 is represented by a load capacitor 130 (also identified as $C_L$) and an associated equivalent series resistance 135 (also identified as $R_{ESR}$ and referred to as effective series resistance). A load current through the load 125 is depicted as a current source $I_L$ in FIG. 1.

As shown in FIG. 1, the linear regulator 105 is placed between the power supplies 110 and 115 such that noise associated with the power supplies 110 and 115 may be decoupled from the load 125. For example, the power supplies 110 and 115 may be switching power supplies. In this example, the linear regulator 105 may attenuate a voltage ripple associated with the input voltage $v_{in1}$ supplied by the power supply 110 to an error amplifier 140 of the linear regulator 105. Such attenuation may mitigate (e.g., reduce or eliminate) adverse effects of noise contributed by the power supply 110 on the load 125, such as sensitive circuitry of the load 125 (e.g., sensitive IoT circuitry), relative to a case in which the linear regulator 105 is not utilized. In this regard, the PSR of the linear regulator 105 may provide a quantitative measure of a capability of the linear regulator 105 to maintain the output voltage $v_{out}$ at a constant value even when the input voltage $v_{in1}$ varies (e.g., exhibits ripple or other noise fluctuation). The filter circuit 120 (e.g., RC filter) provided by resistance $R_F$ and capacitance $C_F$. The filter circuit 120 may be configured to filter an input voltage $v_{in2}$ supplied by the power supply 115 to attenuate a voltage ripple associated with the input voltage $v_{in2}$. The filter circuit 120 may provide the filtered input voltage $v_{in2}$ to a buffer 155 of the linear regulator 105. As an example, the voltages $v_{in1}$, $v_{in2}$, $v_{ref}$, and $v_{out}$ may be around 1.9 V, 3.0 V, 0.9 V, and 1.8 V, respectively. Other voltage levels may be implemented depending on application. In some cases, the linear regulator 105 may be utilized for low current applications. In one example, the linear regulator 105 may consume less than 25 μA. In some cases, the linear regulator 105 may occupy less than 50,000 μm² of area.

In an aspect, the linear regulator 105 may be a low-dropout (LDO) regulator. In this regard, the LDO regulator may be utilized to regulate the output voltage $v_{out}$ even when the input voltage $v_{in1}$ from the power supply 110 is close to the output voltage $v_{out}$ at the LDO regulator's output node. For example, the linear regulator 105 may generate an output voltage $v_{out}$ of 1.8 V based on an input voltage $v_{in1}$ of 1.9 V. The voltage level of 1.8 V may be referred to as a target output voltage level or a regulated output voltage level.

The linear regulator 105 includes an error amplifier 140, a transistor 150, a buffer 155, a transistor 160, a transistor 165, a compensation capacitor 170, a voltage divider 180 (e.g., also referred to as a feedback network), and a voltage-controlled current source 185. The error amplifier 140 includes transistors 145A-J arranged in a folded cascode architecture. In an aspect, as shown in FIG. 1, the error amplifier 140 may be a p-type metal-oxide-semiconductor (PMOS) folded cascode error amplifier. The error amplifier 140 may generate, at an output node of the error amplifier 140, an output voltage $v_{err}$ based at least on feedback voltages $v_{fb1}$ and $v_{fb2}$ and the reference voltage $v_{ref}$. The output voltage $v_{err}$ of the error amplifier 140 may be referred to as an error signal. In this regard, a larger difference between the feedback voltage $V_{fb2}$ and the reference voltage $v_{ref}$ is generally associated with a larger error signal. The error amplifier 140 may be powered by the power supply 110. In an aspect, the error amplifier 140 may be an operational transconductance amplifier (OTA).

The output voltage $v_{err}$ of the error amplifier 140 may track the input voltage $v_{in1}$ provided by the power supply 110. The output voltage $v_{err}$ may be passed directly to a gate of the transistor 160 via the buffer 155. As such, a voltage at the source and gate of the transistor 160 move along with the voltage $v_{in1}$ of the power supply 110 and thus low frequency PSR is enhanced. For a constant load current, the output voltage $v_{out}$ does not change since the source-to-gate voltage across the transistor 160 does not change. In some cases, the PSR may be indicative of how closely a voltage at a source of the transistor 160 and a voltage at a gate of the transistor 160 track each other across different frequencies.

In some embodiments, the PMOS folded cascode error amplifier may be associated with higher PSR (e.g., across all frequencies or at least over a range of frequencies associated with a desired application) than error amplifiers of other architectures. For example, in some applications, the PSR associated with the PMOS folded cascode error amplifier shown in FIG. 1 may be higher than error amplifiers of other architectures at least from DC to a few MHz.

The transistors 145A and 145B form a pair of input PMOS field effect transistors (PMOSFETs). In some cases, the transistors 145A and 145B may be source-body tied to avoid coupling of the voltage $v_{in1}$ from the power supply 110 with the transistors 145A and 145B (e.g., coupling via the body of the input pair). The transistor 150 (e.g., also referred to as a loop gain control transistor or loop gain control switch) is connected to the transistors 145G-H on a first end and to the transistors 145H-I (e.g., the output node of the error amplifier 140) on a second end. The output node of the error amplifier 140 may be referred to as an output of a first stage of the linear regulator 105. A capacitance $C_1$ in FIG. 1 may represent a parasitic capacitance associated with the output of the first stage. A second stage of the linear regulator 105 may refer to components of the linear regulator 105 subsequent to the buffer 155.

The buffer 155 is connected to the error amplifier 140, transistor 160, and transistor 165. In FIG. 1, the buffer 155 is connected to the output node of the error amplifier 140, the gate of the transistor 160, and a drain of the transistor 165. As such, the buffer 155 is provided between the first stage of the linear regulator 105 and the gate of the transistor 160 (e.g., also referred to as a pass transistor). The buffer 155 may buffer (e.g., provide isolation) the output voltage $v_{err}$ of the first stage and provide the voltage $v_{err}$ to the gate of the transistor 160 and the drain of the transistor 165. The buffer 155 may be powered by the power supply 115. In this regard, the voltage $v_{in2}$ provided by the power supply 115 may be filtered by the filter circuit 120 and the filtered voltage used to power the buffer 155. In one example, the buffer 155 may be a low-power buffer (e.g., draws less than 10 μA).

In some aspects, the buffer 155 may be utilized to increase a pole frequency associated with the output of the first stage of the linear regulator 105. The buffer 155 may have a high input impedance, which may effectively increase a pole frequency associated with the output of the error amplifier 140. The buffer 155 may present a low output impedance (e.g., ideally zero) to the gate of the transistor 160, which mitigates (e.g., reduces or eliminates) an effect of the buffer 155 on a frequency response of the linear regulator 105. In this regard, the low output impedance of the buffer 155 may effectively eliminate a pole associated with the gate of the transistor 160. In one example, the buffer 155 may be a cascoded flipped voltage super source follower (CFVSSF).

The transistor 160 is connected to the output node of the linear regulator 105 and provides the output voltage $v_{out}$ on the output node. The power supply 110 applies the voltage $v_{in1}$ on the transistor 160. The transistor 160 may provide the output voltage $v_{out}$ based at least on the voltage $v_{in1}$ from the power supply 110 and the output $v_{eff}$ from the error amplifier 140 (e.g., provided to the gate of the transistor 160 via the buffer 155). In this regard, the output node of the linear regulator 105 is connected to the load 125, compensation capacitor 170, voltage divider 180, and voltage-controlled current source 185.

The compensation capacitor 170 is provided in a feedback loop 175. The feedback loop 175 connects the transistor 160 to the transistors 145A, 145I, and 145J, with the compensation capacitor 170 of the feedback loop 175 connected to the transistors 145A, 145I, 145J, and 160. For example, as shown in FIG. 1, via the feedback loop 175, a drain of the transistor 160 is coupled to a drain of the transistor 145A, a source of the transistor 145I, and a drain of the transistor 145J. The compensation capacitor 170 may provide a feedback voltage $v_{fb1}$ to the transistors 145A, 145I, and 145J. For example, the voltage $v_{fb1}$ may be applied at the drain of the transistors 145A and 145J and the source of the transistor 145I. In some cases, the compensation capacitor 170 may have a configurable capacitance. In other cases, the compensation capacitor 170 does not have a configurable capacitance. In one example, the capacitance $C_C$ of the compensation capacitor 170 may be less than around 5 pF to around 10 pF.

The compensation capacitor 170 may minimize coupling from the power supply 110 to the output node of the linear regulator 105 (e.g., minimize coupling of the power supply 110 with the voltage $v_{out}$). In some cases, the compensation capacitor 170 may be referred to as a cascoded Miller compensation capacitor and/or may be referred to as providing cascoded Miller compensation. In an aspect, the feedback loop 175 has no feedforward component, where a feedforward component if present is generally associated with a right-hand plane (RHP) zero and may potentially cause oscillation.

The voltage divider 180 may be provided by resistors $R_1$ and $R_2$. An output voltage $v_{fb2}$ (e.g., also referred to as a feedback voltage) of the voltage divider 180 is provided to the transistor 145B (e.g., a gate of the transistor 145B) via a feedback loop 190. In an aspect, the voltage divider 180 may be referred to as a voltage generator or a feedback network (e.g., resistive feedback network). In some cases, the resistors $R_1$ and $R_2$ may be placed in a ground p-type well such that the resistors are isolated from coupling to the power, supply 110. The voltage-controlled current source 185 is connected to the transistor 160 and the voltage divider 180. The voltage-controlled current source 185 provides a current that may flow through the resistors $R_1$ and $R_2$ of the voltage divider 180 and generate the feedback voltage $v_{fb2}$. As the feedback voltage $v_{fb2}$ is provided to the transistor 145B (e.g., the gate of the transistor 145B), the feedback voltage $v_{fb2}$ causes the error amplifier 140 to respond (e.g., causing a change in the voltage $v_{eff}$), which in turn causes the feedback loops 175 and 190 to respond (e.g., causing a change in the voltages $v_{fb1}$ and $v_{fb2}$). In an aspect, such feedback facilitated by the voltage-controlled current source 185 may allow PSR improvement.

In an embodiment, the voltage-controlled current source 185 may provide an LHP zero (e.g., of the $v_{out}/v_{ref}$ transfer function) for the linear regulator 105, as further described herein. In an aspect, the LHP zero of the $v_{out}/v_{ref}$ transfer function corresponds to an LHP pole of the $v_{out}/v_{in1}$ transfer function (e.g., also referred to as the power supply transfer function of the power supply 110). The voltage-controlled current source 185 may be considered as being coupled to the feedback loop 190 or may be considered as forming part of the feedback loop 190. In one example, the voltage-controlled current source 185 may provide a current that is based on the output voltage $v_{out}$ (e.g., voltage difference between $v_{out}$ and ground) multiplied by the susceptances $C_{sense}$ associated with a capacitor (not shown) of capacitance $C_{sense}$ of the voltage-controlled current source 185. As shown in FIG. 1, the transistors 145A and 145B forming the input pair of the error amplifier 140 receive the voltage $v_{out}$ via the feedback loop 175 and the voltage $V_{fb2}$ via the feedback loop 190, respectively.

In some embodiments, the linear regulator 105 may provide a high PSR response over a wider frequency range. In this regard, such high PSR response may encompass DC PSR response (e.g., at or near zero frequency) and alternating current (AC) PSR response (e.g., at higher frequencies). A frequency response of the linear regulator 105 is described with respect to FIG. 2.

In some embodiments, the compensation capacitor 170 and the LHP zero (e.g., of the $v_{out}/v_{ref}$ transfer function) provided by the voltage-controlled current source 185 may allow the linear regulator 105 to provide a high AC PSR response. In some aspects, the compensation capacitor 170 may be provided for stability and phase margin, whereas the LHP zero associated with the voltage-controlled current source 185 may be provided for PSR. For example, absent the compensation capacitor 170, stability may be provided (e.g., such as in a light load condition) by decreasing loop gain, which may cause an associated degradation in PSR. As such, in some aspects, utilization of the compensation capacitor 170 together with the voltage-controlled current source 185 may allow maintaining of a high AC PSR even when the equivalent series resistance 135 of the load capacitor 130 is low (e.g., less than 200 me), as further described herein.

The compensation capacitor 170 may be utilized to allow sufficient PSR (e.g., at least moderate PSR) at low frequency (e.g., moderate gain in the first stage of the linear regulator 105). In some cases, a linear regulator with such capacitive compensation, and with a buffer between the first and second stages of the linear regulator, may be associated with a low phase margin at low load currents. A light load condition may refer to a condition in which there is a low load current across the load 125. As an example, the light load condition may occur when the load current is less than 100 μA.

In FIG. 1, in some embodiments, the linear regulator 105 may accommodate light load conditions by utilizing the transistor 150 and/or the transistor 165 and avoid the low phase margin that may be associated with utilization of the compensation capacitor 170 under light load conditions. The transistor 150 and/or transistor 165 may be closed (e.g., turned on) to accommodate light load conditions and opened (e.g., turned off) when not under light load conditions. In some cases, for example, light load condition may occur when a load current across the load 125 is less than 100 μA.

In one aspect, during light load condition, the transistor 150 may be closed to reduce the gain of the first stage of the linear regulator 105, which may allow an increased phase margin for the feedback loop 190. In some cases, a reduction of the gain of the first stage may be associated with a reduced PSR. For example, the loop gain may be reduced by around 20 dB. Such a reduction in PSR may generally be acceptable in the light load condition (e.g., the linear regulator 105 is supplying low or no load current). In this regard, in some cases, the voltage regulation system 100 may be in the light load condition generally when minimal circuitry is enabled in the load 125 and/or the linear regulator 105. The transistor 150 may be opened once a sufficient load current (e.g., load current greater than 100 μA in some cases) is present and thus the voltage regulation system 100 is out of light load condition. Once the voltage regulation system 100 is out of light load condition and the transistor 150 is opened, the feedback loop 190 is generally stable and the PSR (e.g., low frequency PSR) of the linear regulator 105 is generally higher compared to when the transistor 150 is closed.

In another aspect, during light load condition, the transistor 165 may be closed to drive an output of the buffer 155 to ground and allow the transistor 165 to act like a closed switch. In some cases, the transistor 165 may be closed with a remainder of the linear regulator 105 disabled. With the transistor 165 closed, the input supply voltage $v_{in1}$ provided by the power supply 110 may directly charge $v_{out}$ (e.g., directly charge the output node of the linear regulator 105). The transistor 165 may be opened and the linear regulator 105 enabled once a sufficient load current is present and thus the voltage regulation system 100 is out of light load condition. It is noted that there may be a brief amount of time where the output voltage $v_{out}$ is not regulated. In general, this lack of regulation is not an issue since the load capacitor 130 is generally large (e.g., greater than 300 nF) and because linear regulators (e.g., the linear regulator 105) generally do not regulate overvoltage as well as they regulate under-voltage. As such, by selectively operating (e.g., closing, opening) the transistor 150 and/or the transistor 165, the linear regulator 105 may be stable and have sufficient PSR and phase margin while accommodating a wide range of loads, including loads associated with low load currents (e.g., less than 100 µA) during light load condition.

Control signals for the transistor 150 (e.g., depicted as control signal $v_{LG\_ctrl}$ in FIG. 1) and the transistor 165 (e.g., depicted as control signal $V_{bypass}$) may be provided by one or more control circuits. For example, the control circuit(s) may generate such control signals based on a load current across the load 125. The load current may be measured by the control circuit(s) and/or sensor(s) communicatively coupled to the control circuit(s). Although FIG. 1 illustrates an implementation in which the transistors 150 and 165 are provided, in some embodiments only the transistor 150 is provided or only the transistor 165 is provided. In some aspects, light load conditions may be associated with preliminary operation of the load 125, such as communication of a signal(s) to wake up the load 125. As such, during operation under light load condition, a PSR may be allowed to be lower (e.g., significantly lower) than during normal operation of the load 125 (e.g., an audio system).

In some aspects, the transistor 150 may be utilized if an analog response of the linear regulator 105 is desired. By turning on the transistor 150, a regulated voltage generated based on a reference voltage is passed to the output $v_{out}$ of the linear regulator 105. Such analog response may be in contrast to using the transistor 165, which serves as a switch to selectively couple the input to or decouple the input from the output of the linear regulator 105 (e.g., couple or decouple the power supply 110 to or from, respectively, the load 125).

In some aspects, the transistor 165 may be used to avoid large surge/charging currents associated with charging the load capacitor 130. In this regard, in some cases, a driving circuitry associated with the power supply 110 may be slew-limited. In such cases, using the transistor 165 during start-up may avoid large surge/charging currents, which may damage circuitry and/or associated wiring (e.g., of the linear regulator 105, load 125, and/or other components). In some cases, the transistor 165 may be used (e.g., instead of the transistor 150) when it is important to maintain a voltage difference between a source voltage and drain voltage of the transistor 160 at a certain level.

Turning now to the voltage-controlled current source 185, the voltage-controlled current source 185 may include a capacitor of capacitance $C_{sense}$ that is associated with (e.g., provides) an LHP zero (e.g., of the $v_{out}/v_{ref}$ transfer function). A susceptance of the capacitor is represented by $sC_{sense}$ in FIG. 1. In an aspect, the capacitance $C_{sense}$ may be around 1 pF to around 5 pF. In this regard, the voltage-controlled current source 185 may provide an LHP zero in the feedback loop 190 of the linear regulator 105. In an aspect, in FIG. 1, the effective ESR may include a resistance associated with the load capacitor 130 and resistance along a path from the output of the linear regulator 105 to the ground terminal connected to a bottom plate of the load capacitor 130. The load capacitor 130 and the equivalent series resistance 135 may also form an LHP zero. Introduction of an LHP zero by the voltage-controlled current source 185 may be utilized in applications where the effective ESR of the load capacitor 130, depicted by the equivalent series resistance 135, is relatively small. As an example, the effective ESR may be less than 200 mΩ. In some cases, if the resistance of the equivalent series resistance 135 is too small, the LHP zero provided by the load capacitor 130 does not stabilize the feedback loop 190.

In some cases, the linear regulator 105 may accommodate applications where the equivalent series resistance 135 is greater than 200 mΩ and thus the LHP zero provided by the load capacitor 130 and the equivalent series resistance 135 can be at low enough frequencies to stabilize the feedback loop 190. In these cases, the two LHP zeroes may cancel with two LHP poles, which may destabilize the linear regulator 105. However, in some embodiments, by utilizing the compensation capacitor 170 together with the voltage-controlled current source 185, the linear regulator 105 may maintain stability (e.g., prevent destabilization associated with the two LHP zeroes) and high PSR over a wide range of frequencies and a wide range of effective ESR, such as including when the equivalent series resistance 135 is low (e.g., less than 200 me).

In an embodiment, the capacitance $C_{sense}$ may be configurable. The capacitance $C_{sense}$ may introduce an LHP zero into the $v_{out}/v_{ref}$ transfer function. The LHP zero may cause a stability concern if it is relatively close in frequency to an LHP zero associated with the load 125 (e.g., the load capacitor 130 and associated equivalent series resistance 135). For example, the LHP zero of the $v_{out}/v_{ref}$ transfer function and LHP zero of the load 125 may cancel LHP poles and cause destabilization of the linear regulator 105. Configurability of the capacitance may allow the linear regulator 105 to accommodate different and/or unknown values of load capacitance and associated equivalent series resistance. For example, ASICs that include a linear regulator with the architecture of the linear regulator 105 may be employed in different packages. Each package may have its own load capacitance and associated equivalent series resistance. To support the different packages, the capacitance $C_{sense}$ of each linear regulator of each ASIC may be configured (e.g., programmed) to accommodate the package. For a given load, the capacitance $C_{sense}$ may be configured with a certain value. An example of the voltage-controlled current source 185 with a capacitor of capacitance $C_{sense}$ is described with respect to FIG. 5.

In some embodiments, the error amplifier 140 and transistor 160 may be powered by the power supply 110, whereas the buffer 155 may be powered by the power supply 115. Utilization of these different power supplies may facilitate stability of the feedback loop 190, such as at small load currents (e.g., less than 100 µA). In some cases, the power supplies 110 and 115 may be supplied by an on-chip DC-DC converter. For example, consider a case (not shown) where the load current is zero and the buffer 155 is supplied with the voltage $v_{in1}$ by the power supply 110 along with the error amplifier 140 and transistor 160. As such, a voltage applied to the gate of the transistor 160 is equal to or nearly equal to the input voltage $v_{in1}$ supplied by the power supply 110. In this regard, with the load current at zero, the gate of the transistor 160 is at a gate voltage of 1.9 V to turn off the transistor 160, and thus the source-to-gate voltage $V_{SG}$ of the transistor 160 is about 0 V. Depending on an architecture of the buffer 155 (e.g., the buffer 155 is not a simple source follower), voltage headroom issues may occur (e.g., PMOS transistors may have drain-to-source voltage $V_{DS}$ of 0 V). For example, the transistor 160 may have little or no voltage headroom.

Such voltage headroom issues may be avoided by supplying the buffer 155 with a different power supply than the power supply 110. In this regard, as shown in FIG. 1, the buffer 155 is supplied by the power supply 115. In one example, the buffer 155 may be a low-power buffer (e.g., less than 10 μA). The low frequency PSR of the buffer 155 with the filter circuit 120 may mitigate (e.g., reduce or eliminate) supply ripple associated with the power supply 115. In some cases, the filter circuit 120 may be utilized to prevent degradation of AC PSR (e.g., higher frequency PSR) of the linear regulator 105 by the power supply 115, whereas the buffer 155 does not adversely affect DC PSR (e.g., lower frequency PSR) of the linear regulator 105.

It is noted that the voltage regulation system 100 of FIG. 1 provides an example arrangement of components in accordance with an embodiment of the present disclosure. In other embodiments, additional components, different components, and/or fewer components, and/or arrangement of the components shown in FIG. 1, may be utilized. As one example, the linear regulator 105 may contain current limiting circuitry not shown in FIG. 1. Such circuitry may be designed to not degrade PSR performance. As another example, the linear regulator 105 provides an arrangement of PMOS and n-type MOS (NMOS) transistors for the error amplifier 140. A different number of PMOS and NMOS transistors and/or arrangement thereof than that shown in FIG. 1 may be utilized. In this regard, although the error amplifier 140 of FIG. 1 is a PMOS folded cascode error amplifier, other types of error amplifiers may be utilized.

Figure 2:
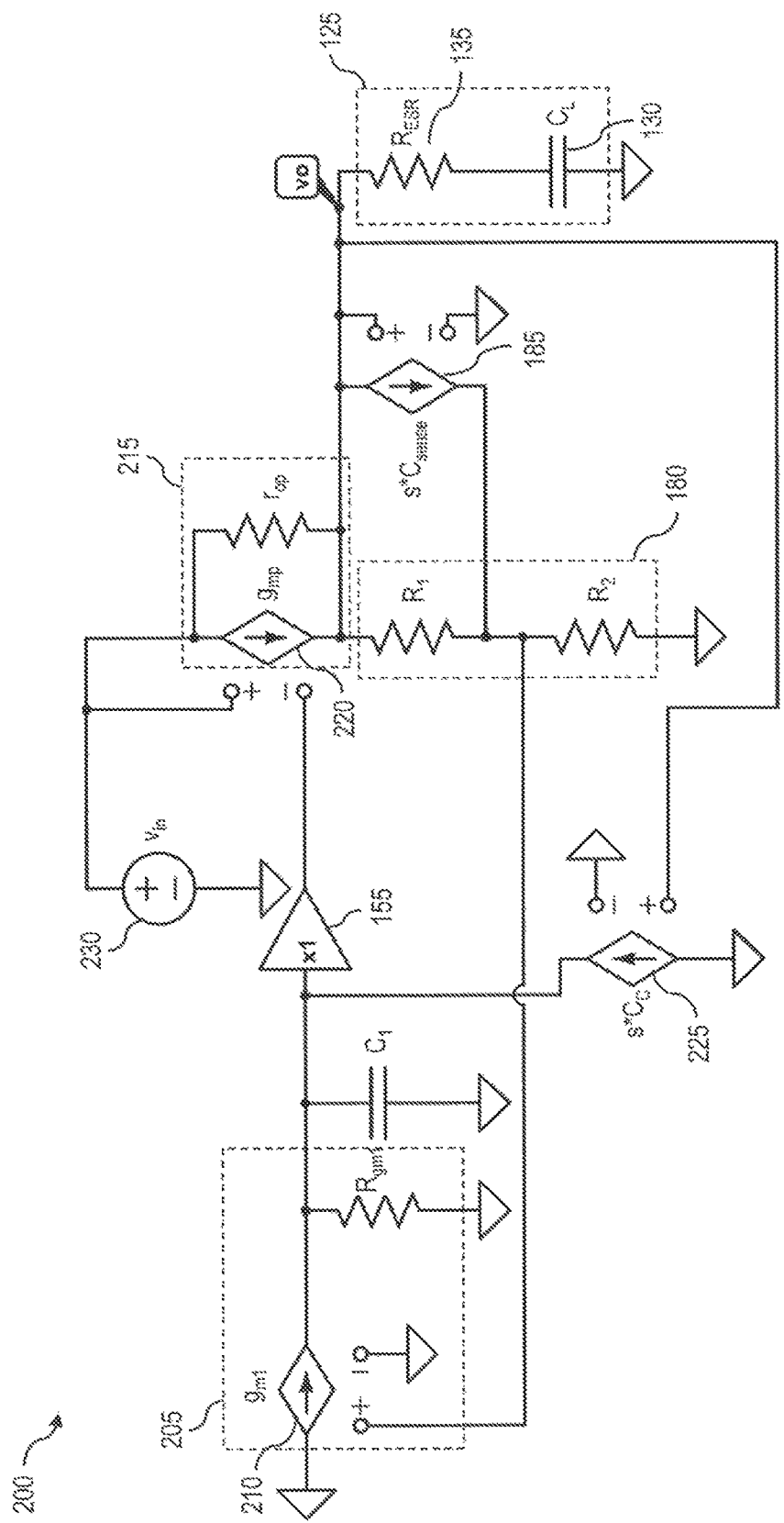
FIG. 2 illustrates a small-signal power supply rejection model associated with the voltage regulation system of FIG. 1 in accordance with one or more embodiments of the present disclosure.

FIG. 2 illustrates a small-signal PSR model 200 of the linear regulator 105 of FIG. 1 in accordance with one or more embodiments of the present disclosure. A small-signal representation 205 of the error amplifier 140 of FIG. 1 is provided by a voltage-controlled current source (VCCS) 210 (e.g., also identified by an associated transconductance $g_{m1}$) and resistor $R_{gm1}$. The resistor $R_{gm1}$ may represent an output impedance of the error amplifier 140. The capacitor $C_1$ may be a parasitic capacitance at the output of the error amplifier 140 (e.g., the output of the first stage of the linear regulator 105). A small-signal representation 215 of the transistor 160 is provided by a VCCS 220 (e.g., also identified by an associated transconductance $g_{mp}$) and an associated output resistance $r_{op}$. The buffer 155 is inserted between the first stage of the linear regulator 105 and the gate of the transistor 160. The small-signal PSR model 200 further includes a VCCS 225 associated with a susceptance of $sC_C$, where $C_C$ represents a capacitance of the compensation capacitor 170. The small-signal PSR model 200 also includes the VCCS 185 associated with a susceptance of $sC_{sense}$, where $C_{sense}$ represents a capacitor that generates an LHP zero (e.g., of the $v_{out}/v_{ref}$ transfer function) in the feedback loop 190.

As shown in FIG. 2, voltage dependence of the VCCS 210 is provided by a voltage difference between a feedback voltage from the voltage divider 180 and ground. The VCCS 210 may provide a current that is based on this voltage difference. Voltage dependence of the VCCS 220 is provided by a voltage difference between a small-signal input $v_{in}$ (provided by a small-signal power supply 230) and an output of the buffer 155. The VCCS 210 may provide a current that is based on this voltage difference. In this regard, the small signal input $v_{in}$ may represent a voltage ripple of the voltage $v_{in1}$ provided by the power supply 110. Voltage dependence of the VCCS 225 is provided by a voltage difference between a small-signal output $v_o$ and ground. The VCCS 225 may provide a current that is based on this voltage difference. Voltage dependence of the VCCS 185 is provided by a voltage difference between the small-signal output $v_o$ and ground. The VCCS 185 may provide a current that is based on this voltage difference. In an aspect, a VCCS may be referred to as an OTA. In an aspect, a VCCS may be referred to as an OTA.

In some cases, the buffer 155 may be utilized to increase a pole frequency associated with the output of the first stage. The buffer 155 may present low output impedance (e.g., ideally zero) to the gate of the transistor 160, which mitigates (e.g., eliminates) an effect of the buffer 155 on the frequency response associated with the linear regulator 105. The buffer 155 may isolate the gate of the transistor 160 and output of the error amplifier 140.

In a case that the transistor 160 is in saturation, the transfer function associated with the linear regulator 105 may be provided by:

$$PSR = \frac{v_o}{v_{in}} \approx \frac{(1+sC_1R_{gm1})(1+sC_LR_{ESR})g_{mp}}{C_LC_1R_1\alpha\left(s+\frac{g_{m1}\beta}{C_C+g_{m1}R_F\beta C_{sense}}\right)\left(s+\frac{g_{mp}}{C_1C_L\alpha}(C_C+g_{m1}R_F\beta C_{sense})\right)}$$

where $v_{in}$ represents the small-signal input to the power supply of the linear regulator 105, $v_o$ represents the small-signal output voltage of the linear regulator 105, $g_{m1}$ represents the transconductance of the first stage of the linear regulator 105, $R_{gm1}$ represents the output resistance of the first stage of the linear regulator 105, $\beta$ is a feedback factor associated with voltage division of the small-signal output voltage $v_o$ by the voltage divider 180 (via the resistors $R_1$ and $R_2$), $C_L$ represents a capacitance of the load capacitor 130 of the second stage of the linear regulator 105, $C_1$ represents a capacitance of a load capacitor of the first stage (e.g., parasitic capacitance), $g_{mp}$ represents the transconductance of the transistor 160, $r_{op}$ represents the output resistance of the transistor 160, and $R_{ESR}$ represents a resistance of the equivalent series resistance 135 of the load capacitor 130. The feedback factor $\beta$ may be provided by $\beta=R_2/(R_1+R_2)$. In some cases, $R_2 > R_1$ such that $1.0 > \beta > 0.5$.

As shown by the transfer functions, a first LHP zero occurs at $1/(R_1C_1)$. In an aspect, the first LHP is generally at a relatively low frequency (e.g., less than 100 kHz) since the output resistance of an OTA (e.g., represented by $R_{gm1}$) is generally a large resistance. The DC PSR (i.e., PSR at s=0) can be provided by (or approximately provided by):

$$PSR|_{s=0} = \left.\frac{v_o}{v_{in}}\right|_{s=0} \approx \left.\frac{(1+sC_1R_{gm1})(1+sC_LR_{ESR})g_{mp}}{C_LC_1R_1\alpha\left(s+\frac{g_{m1}\beta}{C_C+g_{m1}R_F\beta C_{sense}}\right)\left(s+\frac{g_{mp}}{C_1C_L\alpha}(C_C+g_{m1}R_F\beta C_{sense})\right)}\right|_{s=0} = \frac{1}{g_{m1}R_{gm1}\beta}$$

This first LHP zero and DC PSR together may be used to determine a needed $g_{m1}$ and $R_{gm1}$. A second LHP zero occurs at $1/(C_L R_{ESR})$ and is typically at a relatively high frequency (e.g., greater than 1 MHz) if $R_{ESR}$ is relatively small (e.g., less than 200 me).

The poles (e.g., denominator equals zero) are real and located at the following frequencies:

$$\omega_{P1} \text{ at } \frac{-g_{m1}\beta}{C_C + g_{m1}R_F\beta C_{sense}}$$

$$\omega_{P2} \text{ at } \frac{-g_{mp}}{C_1 C_L \alpha}(C_C + g_{m1}R_F\beta C_{sense})$$

where $\alpha$ is a factor dependent on $C_1$ and $R_F = R_1 + R_2$. In one example, $\alpha \approx 1.2$.

In some aspects, the variables $g_{m1}$, $g_{mp}$, $\beta$, $C_1$, and $C_L$ may be set primarily based on considerations other than AC PSR. In some cases, for example, the transconductance $g_{m1}$ associated with the error amplifier 140 (e.g., DC gain associated with the first stage of the linear regulator 105) may be determined by a DC PSR requirement, transconductance $g_{mp}$ associated with the transistor 160 may be determined by area requirements/constraints and accommodated loads (e.g., range of load currents to be accommodated by the linear regulator 105), $\beta$ may be determined by a resistor divider, $C_1$ may be made as small as possible (e.g., less than 50 fF) and may be a function of device sizing and layout parasitics, and load capacitor 130 may be determined by stability requirements. As such, in some cases, the variables $g_{m1}$, $g_{mp}$, $\beta$, $C_1$, and $C_L$ are not adjustable solely for purposes of PSR.

The capacitances $C_C$ and $C_{sense}$ may provide variables that may be set to facilitate higher PSR over a wider frequency range. The capacitance $C_C$ may be increased to allow higher PSR. In this regard, the capacitance $C_C$ may be increased to a certain level based on size constraints (e.g., area usable for providing the capacitance $C_C$) and/or bandwidth considerations (e.g., too low a bandwidth at the feedback loop 190 may cause the linear regulator 105 to have insufficient speed). The expressions for the poles both contain the term $C_C + g_{m1}R_F\beta C_{sense}$, which, as the term increases results in decreasing $\omega_{P1}$ and increasing $\omega_{P2}$. The $C_C$ and $C_{sense}$ may be set to push out the two poles, such that the poles may cancel the zeroes of the transfer function. Such additive pole-splitting behavior is associated with a smoother (e.g., non-peaking PSR curve) and is generally desirable. In an aspect, the LHP pole of the $v_o/v_{in}$ transfer function provided at least in part by the voltage-controlled current source 185 is associated with an LHP zero of the $v_{out}/v_{ref}$ transfer function. An example of a PSR curve is described, for example, with respect to FIG. 4.

In some embodiments, utilization of the compensation capacitor 170 together with the voltage-controlled current source 185 (e.g., with the capacitor $C_{sense}$) may facilitate obtaining a desired AC PSR while maintaining a relatively large bandwidth (e.g., in the $v_{out}/v_{ref}$ transfer function) and accommodating a wide range of loads. For example, the bandwidth may encompass up to at least 2 or 3 MHz. The LHP zero of the $v_{out}/v_{ref}$ transfer function associated with the voltage-controlled current source 185 may increase the bandwidth associated with the feedback loop 190 and speed up the transient response of the linear regulator 105. This is desirable but, as mentioned previously, cannot solely be relied upon in a case with low $R_{ESR}$ values. In a case that the voltage-controlled current source 185 is not utilized, the capacitance of the compensation capacitor 170 may be increased to account for the absence of the LHP zero of the $v_{out}/v_{ref}$ transfer function (e.g., or absence of a corresponding LHP pole of the $v_{out}/v_{in1}$ transfer function) associated with the voltage-controlled current source 185. However, increasing the capacitance $C_C$ of the compensation capacitor 170 may reduce the bandwidth associated with the feedback loop 190 and may slow down the transient response of the linear regulator 105. As such, utilization of the compensation capacitor 170 together with the voltage-controlled current source 185 can be used to obtain the desired AC PSR while still maintaining a relatively large bandwidth and accommodating a wide range of loads.

Figure 3:
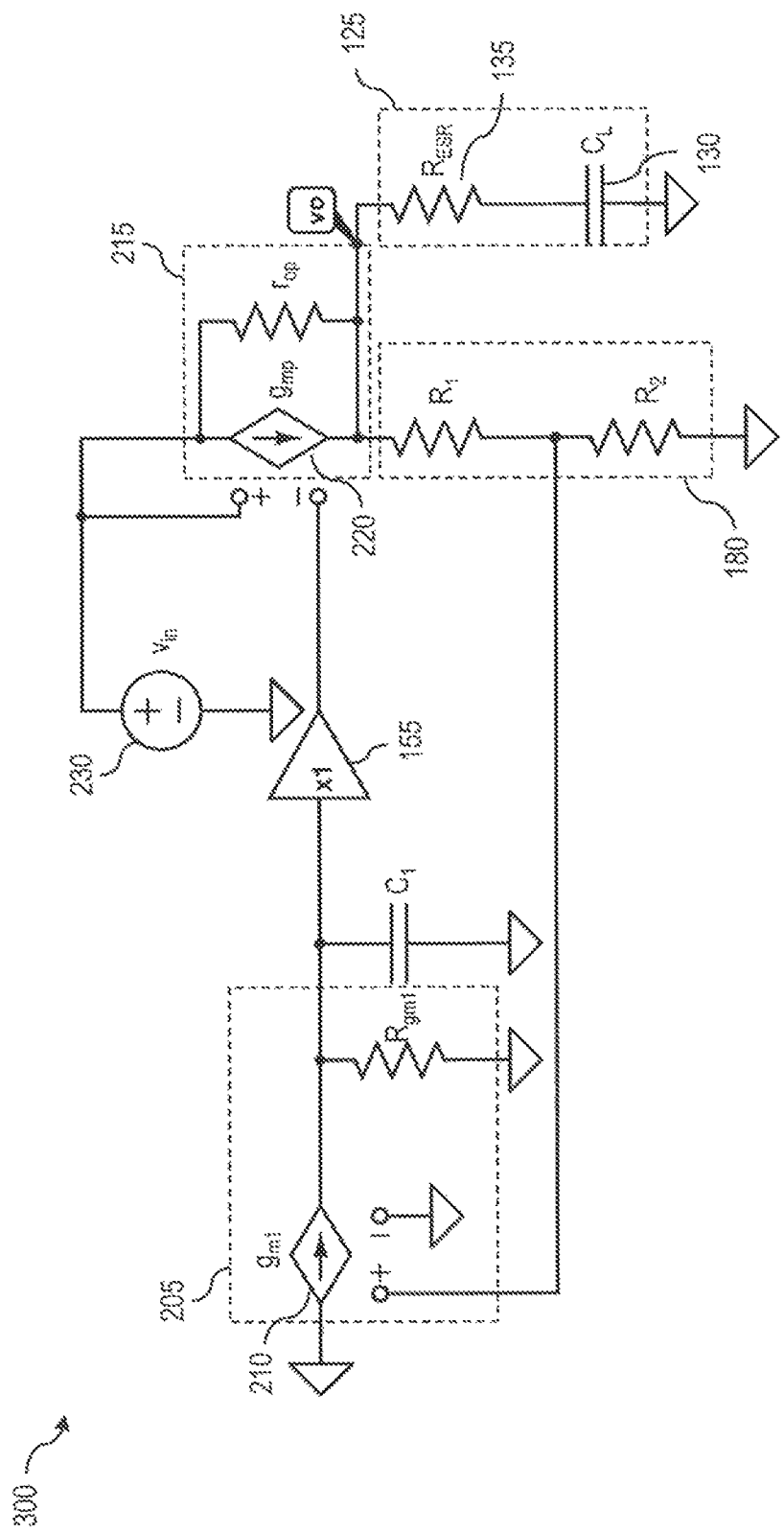
FIG. 3 illustrates a small-signal power supply rejection model of a linear regulator.

FIG. 3 illustrates a small-signal PSR model 300 of a linear regulator without the compensation capacitor 170 (e.g., for providing cascoded Miller compensation) and the voltage-controlled current source 185 (e.g., for providing a LHP zero of the $v_{out}/v_{ref}$ transfer function). In this regard, the voltage-controlled current sources 225 and 185 shown in FIG. 2 are not in FIG. 3. In a case that the transistor 160 is in saturation, the transfer function associated with the linear regulator may be provided by:

$$PSR = \frac{v_o}{v_{in}} \approx \frac{(1 + sC_1 R_{gm1})(1 + sC_L R_{ESR})}{g_{m1} R_{gm1} \beta \left(s^2 \frac{C_L C_1}{g_{m1} g_{mp} \beta} + sC_L R_{ESR} + 1\right)}$$

where the various variables (e.g., $v_{in}$, $v_o$, $g_{m1}$, $R_{gm1}$, etc.) are the same as those described with reference to FIG. 2. As shown by the transfer function, the DC PSR (e.g., PSR at s=0) and LHP zeroes are the same as those for the small-signal PSR model 200 for FIG. 2, while the poles of the transfer function are different. In this regard, the DC PSR can be provided by (or approximately provided by):

$$PSR|_{s=0} = \left. \frac{v_o}{v_{in}} \right|_{s=0} \approx \left. \frac{(1 + sC_1 R_{gm1})(1 + sC_L R_{ESR})}{g_{m1} R_{gm1} \beta \left(s^2 \frac{C_L C_1}{g_{m1} g_{mp} \beta} + sC_L R_{ESR} + 1\right)} \right|_{s=0} = \frac{1}{g_{m1} R_{gm1} \beta}$$

The poles are a complex-conjugate pair (e.g., in contrast to the poles being real for the small-signal PSR model 200). A natural frequency $\omega_0$ and quality factor Q of the complex-conjugate pair occur at:

$$\omega_0 = \sqrt{\frac{g_{m1} g_{mp} \beta}{C_L C_1}}$$

$$Q = \sqrt{\frac{C_1}{C_L g_{m1} g_{mp} \beta}} \frac{1}{R_{ESR}}$$

The expression for $\omega_0$ shows that it is a function of variables typically set by considerations other than AC PSR. As such, in some cases, the variables $g_{m1}$, $g_{mp}$, $\beta$, $C_1$, and $C_L$ are not adjustable (e.g., by a designer) solely for purposes of PSR. The expression for Q is a function of $R_{ESR}$ and the same variables as $\omega_0$. Thus, for small $R_{ESR}$, the Q can be relatively large (e.g., greater than 5), which may cause peaking at $\omega_1$ in the PSR response. The Q becomes tighter as $R_{ESR}$ increases.

Figure 4:
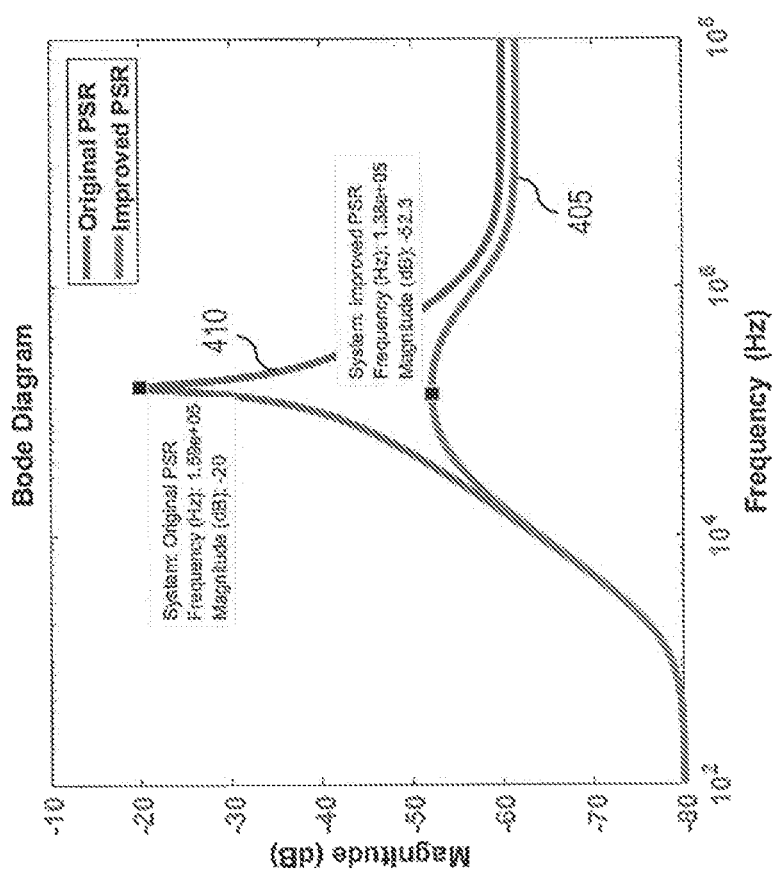
FIG. 4 illustrates an example of a bode diagram with power supply rejection as a function of frequency for the small-signal power supply rejection models of FIGS. 2 and 3 in accordance with one or more embodiments of the present disclosure.

FIG. 4 illustrates an example of a bode diagram with PSR as a function of frequency for the small-signal PSR models 200 and 300 of FIGS. 2 and 3, respectively, in accordance with one or more embodiments of the present disclosure. In particular, FIG. 4 illustrates curves 405 and 410 associating the PSR and frequency for the small-signal PSR models 200 and 300 of FIGS. 2 and 3, respectively.

The curves 405 and 410 substantially overlap between DC (e.g., around 0 Hz) and around $10^4$ Hz and are similar between around $10^6$ Hz and $10^8$ Hz. The small-signal PSR model 300 exhibits a lower PSR (e.g., in magnitude) than the small-signal PSR model 200 at frequencies higher than around 10 kHz, with the curve 410 peaking with a PSR of around −20 dB at around 160 kHz. The small-signal PSR model 200 exhibits a higher PSR (e.g., in magnitude) than the small-signal PSR model 300 especially in the range from around 10 kHz to around 1 MHz, with the curve 405 peaking with a PSR of around −52.3 dB at around 138 kHz. At around their respective peaks, the curve 405 is smoother and has a higher PSR than the curve 410. In some cases, the curves 405 and 410 may be indicative of how closely a voltage at a source of the transistor 160 and a voltage at a gate of the transistor 160 track each other across different frequencies.

Figure 5:
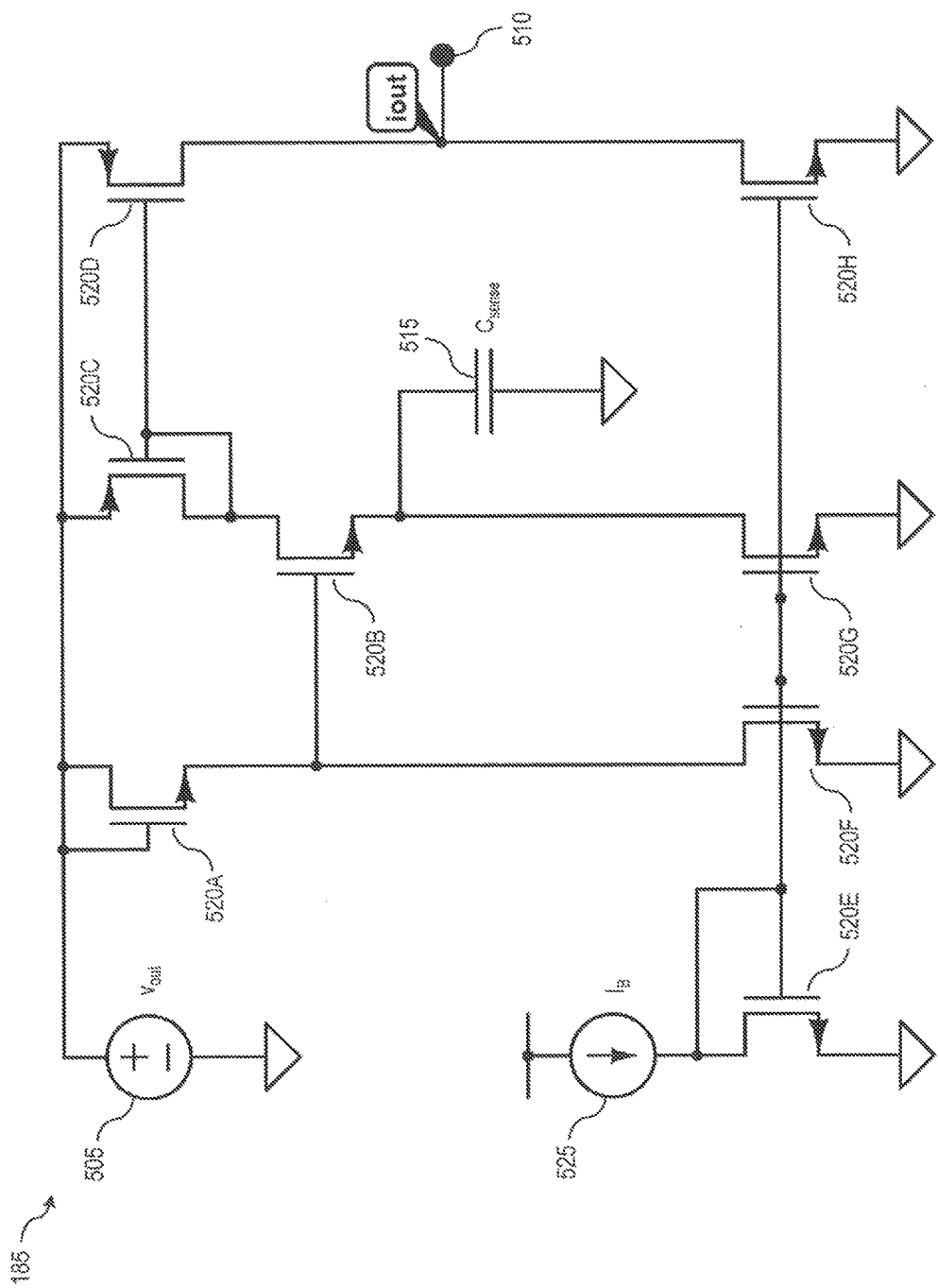
FIG. 5 illustrates an example of a voltage-controlled current source in accordance with one or more embodiments of the present disclosure.

FIG. 5 illustrates an example of the voltage-controlled current source 185 of FIG. 1 in accordance with one or more embodiments of the present disclosure. It is noted that FIG. 5 presents one example topology of the voltage-controlled current source 185. Other topologies may be utilized.

The voltage-controlled current source 185 includes a power supply 505, a capacitor 515 of capacitance $C_{sense}$, transistors 520A-H, and a bias current source 525. The power supply 505 may represent the output voltage $v_{out}$ shown in FIG. 1. An output current $i_{out}$ is provided by the voltage-controlled current source 185 to a node 510. With reference to FIG. 1, the node 510 may be, or may be coupled to a node, between the resistors $R_1$ and $R_2$ of the voltage divider 180 and at a voltage $v_{fb2}$. In an aspect, the voltage-controlled current source 185 may generate the output current $i_{out}$ based on the output voltage $v_{out}$ and the capacitance $C_{sense}$ of the capacitor 515.

The transistors 520A and 520B each provide a source-follower. For the transistor 520A, its gate is tied to its drain. A source voltage of the transistor 520A follows a voltage at its gate. As such, a power supply ripple may be copied from the gate of the transistor 520A to the source of the transistor 520A. The source voltage of the transistor 520A is provided to the gate of the transistor 520B to drive the transistor 520B. A source voltage of the transistor 520B therefore includes a power supply source ripple. The source voltage transfers such source ripple onto the capacitor 515 (e.g., a top plate of the capacitor 515) of capacitance $C_{sense}$.

The capacitor 515 is connected to the transistor 520C (e.g., via the transistor 520B) and the transistor 520G. Changes in a voltage on the top plate of the capacitor 515 may cause appropriate current sourcing or current sinking by the transistor 520C and 520G, respectively. In this regard, when the voltage on the top plate of the capacitor 515 changes in a direction that may necessitates sourcing, the transistor 520C may source current to the top plate. When the voltage on the top plate of the capacitor 515 changes in a direction that may necessitates sinking, the transistor 520G may sink current from the top plate.

The transistors 520D-H are current mirrors biased by the bias current source 525. As an example, the bias current $I_B$ from the bias current source 525 may be 1 µA such that the transistors 520E-H are biased at 1 µA. In this case, when the transistors 520D and 520H have a same current of 1 µA flowing through, no current (e.g., zero current) is provided to the node 510. When the voltage at the power supply 505 changes, an associated voltage ripple may be applied on the capacitor 515. In a case that the voltage changes in a direction that involves current sourcing from the transistor 520C, the transistor 520C sources a current on the capacitor 515. For example, the current sourced from the transistor 520C onto the top plate of the capacitor 515 may be around 100 nA. In this example, the transistor 520C has 1.1 µA flowing through (e.g., 1 µA from the bias current $I_B$ and 100 nA due to supply ripple), where 100 nA of the 1.1 µA current flows to the top plate of the capacitor 515. The current flowing through the transistor 520C is mirrored by the transistor 520D, which also sources 1.1 µA. Of the 1.1 µA sourced by the transistor 520D, 100 nA is provided to the node 510 as the output current $i_{out}$. As such, the voltage-controlled current source 185 drives out a current $i_{out}$ based on a voltage across the capacitor 515 of capacitance $C_{sense}$. In FIG. 1, the $i_{out}$ may be provided by $s\,v_{out}\,C_{sense}$.

Figure 6:
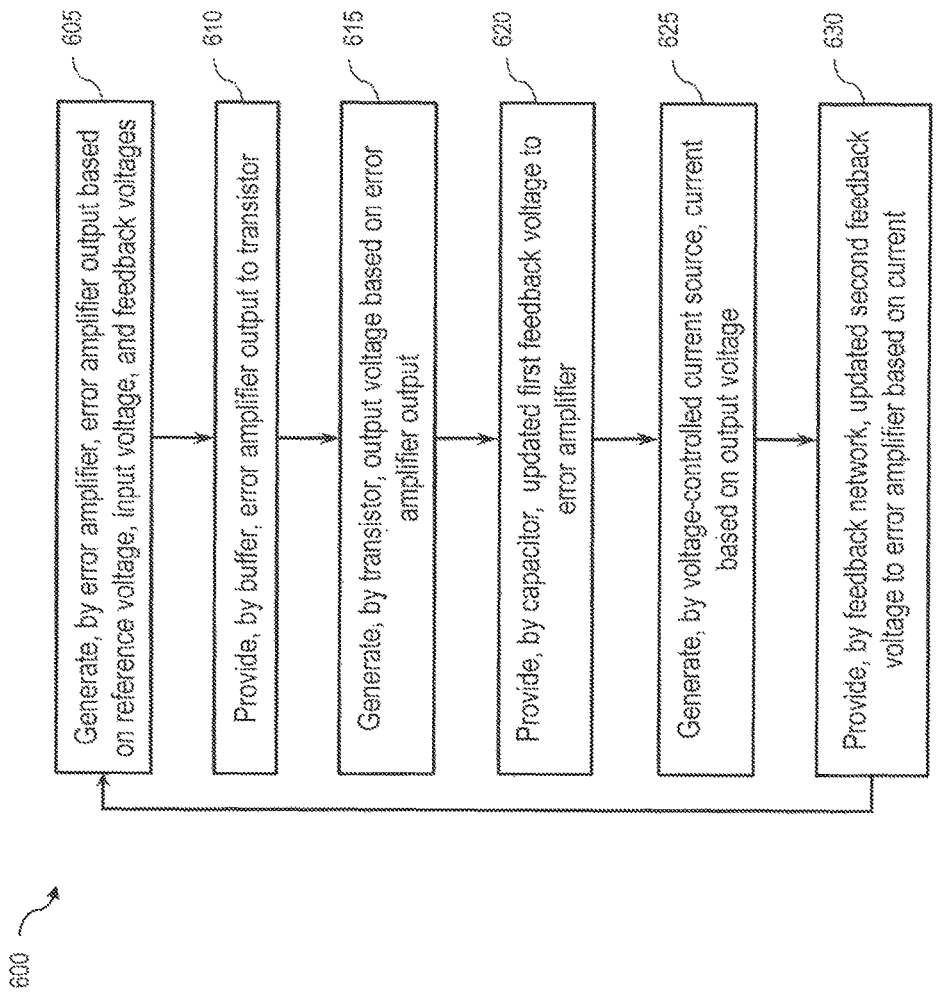
FIG. 6 illustrates a flow diagram of an example process for facilitating voltage regulation in accordance with one or more embodiments of the present disclosure.

FIG. 6 illustrates a flow diagram of an example process 600 for facilitating voltage regulation in accordance with one or more embodiments of the present disclosure. For explanatory purposes, the example process 600 is described herein with reference to the voltage regulation system 100 of FIG. 1, although the example process 600 may be utilized with other systems. Note that one or more operations may be combined, omitted, and/or performed in a different order as desired.

At block 605, the error amplifier 140 generates a first error amplifier output (e.g., $V_{err}$) based at least on the reference voltage $V_{ref}$, the input voltage $v_{in1}$ from the power supply 110, and a first set of feedback voltages (e.g., $v_{fb1}$, $v_{fb2}$). The feedback voltages may be based on a first output voltage (e.g., $v_{out}$) at the output node of the voltage regulation system 100. The first output voltage may be applied to the load 125 at a time $t=t_1$. A first feedback voltage may be provided by the compensation capacitor 170 to the transistors 145A, 145I, and 145J. A second feedback voltage may be provided by the voltage divider 180 to the transistor 145B.

At block 610, the buffer 155 provides the first error amplifier output to the transistor 160. The buffer 155 may provide the first error amplifier output to the gate of the transistor 160. At block 615, the transistor 160 generates a second output voltage at the output node based on the first error amplifier output. The second output voltage may be applied to the load 125 at a time $t=t_2$, where $t_2>t_1$. The linear regulator 105 may generally maintain its output voltage at a near-constant level over time. In this regard, the first output voltage at the output node may be equal to or substantially equal to the second output voltage.

At block 620, the compensation capacitor 170 provides an updated first feedback voltage based on the second output voltage to the transistors 145A, 145I, and 145J. At block 625, the voltage-controlled current source 185 generates a current based on the second output voltage. At block 630, the voltage divider 180 provides an updated second feedback voltage to the transistors 145B. The updated second feedback voltage may be based on the current from the voltage-controlled current source 185 through the voltage divider 180. In this regard, the voltage divider 180 generates the updated second feedback voltage (e.g., $v_{fb2}$) based on current that flows through (e.g., passes through) resistors of the voltage divider 180. The process 600 then proceeds to block 605. In this regard, the error amplifier 140 generates a second error amplifier output based at least on the reference voltage, input voltage $v_{in1}$ from the power supply 110, and a second set of feedback voltages that include the updated first and second feedback voltages. The process 600 may thus be repeated during operation of the voltage regulation system 100 to provide its regulated output voltage to the load 125.

In some embodiments, a determination may be made as to whether a light load condition is satisfied. In some cases, the determination may be made by measuring a load current and comparing the load current to a threshold. For example, the light load condition may be satisfied when the load current is less than around 100 µA. A control circuit(s) may be utilized to generate control signals for selectively operating the transistors 150 and 165. In one example, when the light load condition is satisfied, the control circuit(s) may generate a control signal to close the transistor 150. The transistor 150 may be closed to reduce a gain associated with the error amplifier 140 (e.g., the first stage of the linear regulator 105). In another example, when the light load condition is satisfied, the control circuit(s) may generate a control signal to close the transistor 165. The transistor 165 may be closed to direct an output of the buffer 155 to ground.

Figure 7:
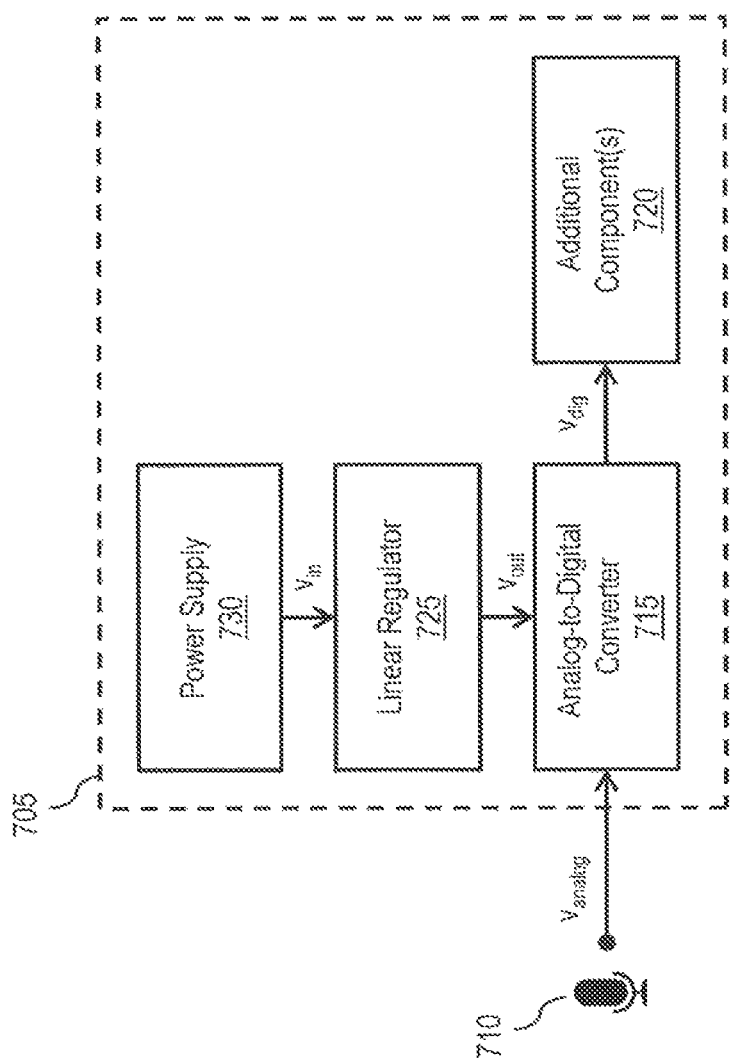
FIG. 7 illustrates an example of an audio system that includes a linear regulator in accordance with one or more embodiments of the present disclosure.

FIG. 7 illustrates an example of an audio system 705 that includes a linear regulator in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components.

The audio system 705 includes an analog-to-digital converter (ADC) 715, additional processor(s) 720, linear regulator 725, and power supply 730. The audio system 705 may receive an analog input signal $V_{analog}$ from an audio device 710 (e.g., a microphone). The ADC 715 may convert the analog input signal $V_{analog}$ and generate an N-bit digital signal (denoted as $v_{dig}$) that is a digital representation of the analog input signal $v_{analog}$. The N-bit digital representation $v_{dig}$ may be provided for further processing and/or storage by one or more additional components 720.

The linear regulator 725 may generate a constant or near-constant voltage $v_{out}$ (e.g., regulated voltage) based on an input voltage $v_{in}$ supplied by the power supply 730, and provide the voltage $v_{out}$ to the ADC 715. In this regard, the ADC 715 and additional component(s) 720 may be considered a load of the linear regulator 725. In some cases, the power supply 730 may be a switching power supply. By placing the linear regulator 725 between the power supply 730 and the load, the linear regulator 725 may prevent noise (e.g., switching noise) associated with the power supply 730 from coupling into the load. As an example, the ADC 715 may have a high dynamic range, such as 20 bits dynamic range (e.g., $v_{dig}$ is 20 bits). For instance, the ADC 715 may have a sigma-delta ADC architecture. The linear regulator 725 may prevent supply noise of the power supply 730 from coupling into the ADC 715, as such coupling may adversely affect precision associated with 20 bits dynamic range provided by the ADC 715.

In an embodiment, the linear regulator 725 may be, may include, or may be a part of, the linear regulator 105 of FIG. 1. The power supply 730 may be, may include, or may be a part of, the power supply 110 and/or 115 of FIG. 1. The ADC 715 and additional component(s) 720 may be, may include, or may be a part of, the load 125 of FIG. 1. Although the foregoing describes operation of the linear regulator 725 for the audio system 705, the linear regulator 725 may be employed to mitigate noise associated with noisy power supplies in generally any system that may utilize noisy power supplies.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:
1. A voltage regulation system comprising:
an error amplifier operable to generate an error amplifier output based at least in part on a reference voltage, a first input voltage, a first feedback voltage, and a second feedback voltage, wherein the first feedback voltage and the second feedback voltage are based at least in part on a first output voltage at an output node of the voltage regulation system;
a capacitor operable to provide the first feedback voltage to a first node of the error amplifier;
a voltage-controlled current source operable to generate a current based at least in part on the first output voltage, wherein the second feedback voltage is based at least in part on the current;
a first transistor operable to provide a second output voltage at the output node based at least in part on the error amplifier output, wherein the first transistor is connected to the output node and the capacitor; and
a buffer operable to provide the error amplifier output to the first transistor, wherein the buffer is connected to the error amplifier and the first transistor,
wherein the error amplifier is operable to be powered by the first input voltage from a first power supply, and
wherein the buffer is operable to be powered by a second input voltage from a second power supply different from the first power supply.

2. The voltage regulation system of claim 1, wherein:
the voltage regulation system comprises a linear regulator, the linear regulator comprising the error amplifier, the first transistor, the capacitor, and the voltage-controlled current source; and
poles associated with the linear regulator are real.

3. The voltage regulation system of claim 1, further comprising a feedback network operable to provide the second feedback voltage to a second node of the error amplifier, wherein the feedback network is connected to the first transistor and the second node, and wherein the voltage-controlled current source is operable to provide the current to the feedback network.

4. The voltage regulation system of claim 3, wherein the error amplifier comprises a plurality of transistors, wherein a first of the plurality of transistors is operable to receive the first feedback voltage from the capacitor, and wherein a second of the plurality of transistors is operable to receive the second feedback voltage from the feedback network.

5. The voltage regulation system of claim 1, further comprising:
the first power supply;
the second power supply; and
a filter circuit operable to filter the second input voltage from the second power supply to obtain a third input voltage and provide the third input voltage to the buffer.

6. The voltage regulation system of claim 1, wherein the error amplifier comprises a p-type metal-oxide-semiconductor (PMOS) folded cascode error amplifier.

7. A voltage regulation system comprising:
an error amplifier operable to generate an error amplifier output based at least in part on a reference voltage, a first input voltage, a first feedback voltage, and a second feedback voltage, wherein the first feedback voltage and the second feedback voltage are based at least in part on a first output voltage at an output node of the voltage regulation system;
a capacitor operable to provide the first feedback voltage to a first node of the error amplifier;
a voltage-controlled current source operable to generate a current based at least in part on the first output voltage, wherein the second feedback voltage is based at least in part on the current;
a first transistor operable to provide a second output voltage at the output node based at least in part on the error amplifier output, wherein the first transistor is connected to the output node and the capacitor; and
a feedback network operable to provide the second feedback voltage to a second node of the error amplifier, wherein the feedback network is connected to the first transistor and the second node, and wherein the voltage-controlled current source is operable to provide the current to the feedback network,
wherein:
the error amplifier comprises a plurality of transistors;
a first of the plurality of transistors is operable to receive the first feedback voltage from the capacitor;
a second of the plurality of transistors is operable to receive the second feedback voltage from the feedback network; and
a third of the plurality of transistors has a source connected to the capacitor and a drain of a fourth of the plurality of transistors.

8. The voltage regulation system of claim 7, further comprising a buffer operable to provide the error amplifier output to the first transistor, wherein the buffer is connected to the error amplifier and the first transistor.

9. The voltage regulation system of claim 8, wherein the error amplifier is operable to be powered by the first input voltage from a first power supply, and wherein the buffer is operable to be powered by a second input voltage from a second power supply different from the first power supply.

10. The voltage regulation system of claim 9, further comprising a second transistor operable to be selectively operated based at least in part on a load current.

11. The voltage regulation system of claim 10, wherein the second transistor is operable to turn on when the load current is below a threshold.

12. The voltage regulation system of claim 10, wherein the second transistor is connected to the error amplifier and the buffer.

13. The voltage regulation system of claim 10, wherein the second transistor is connected to ground, the buffer, and the first transistor.

14. A method comprising:
generating, by an error amplifier, a first error amplifier output based at least in part on a reference voltage, a first input voltage, and a first plurality of feedback voltages, wherein each of the first plurality of feedback voltages is based at least in part on a first output voltage at an output node of a voltage regulation system, wherein the first output voltage is provided to a load, and wherein the error amplifier is powered by the first input voltage from a first power supply;
providing, by a buffer, the first error amplifier output of the error amplifier to a first transistor, wherein the buffer is powered by a second input voltage from a second power supply different from the first power supply;
generating, by the first transistor, a second output voltage at the output node based at least in part on the first error amplifier output, wherein the second output voltage is provided to the load;
providing, by a capacitor, a first feedback voltage of a second plurality of feedback voltages to a first node of the error amplifier, wherein the first feedback voltage is based at least in part on the second output voltage;
generating, by a voltage-controlled current source, a current based at least in part on the second output voltage; and
providing, by a feedback network, a second feedback voltage of the second plurality of feedback voltages to a second node of the error amplifier, wherein the second feedback voltage is based at least in part on the current from the voltage-controlled current source through the feedback network.

15. The method of claim 14, further comprising generating, by the error amplifier, a second error amplifier output based at least in part on the reference voltage, the first input voltage, and the second plurality of feedback voltages.

16. The method of claim 14, wherein:
the voltage regulation system comprises a linear regulator, the linear regulator comprising the error amplifier, the first transistor, the capacitor, and the voltage-controlled current source; and
poles associated with the linear regulator are real.

17. The method of claim 14, further comprising closing a second transistor when a load current is below a threshold, wherein the second transistor is connected to the error amplifier and the buffer, and wherein the second transistor is closed to reduce a gain associated with the error amplifier.

18. The method of claim 14, further comprising closing a second transistor when a load current is below a threshold, wherein the second transistor is connected to the buffer and the first transistor, and wherein the second transistor directs an output of the buffer to ground when the second transistor is closed.

* * * * *